(12) United States Patent
Froidevaux et al.

(10) Patent No.: US 11,133,798 B2
(45) Date of Patent: Sep. 28, 2021

(54) SWITCHABLE DIODE DEVICES HAVING TRANSISTORS IN SERIES

(71) Applicant: STMicroelectronics (Rousset) SAS, Rousset (FR)

(72) Inventors: Nicolas Froidevaux, Aix en Provence (FR); Laurent Lopez, Peynier (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/856,448

(22) Filed: Apr. 23, 2020

(65) Prior Publication Data

US 2020/0343890 A1 Oct. 29, 2020

(30) Foreign Application Priority Data

Apr. 26, 2019 (FR) ...................................... 1904484

(51) Int. Cl.
*H03K 17/687* (2006.01)
*H03K 17/30* (2006.01)

(52) U.S. Cl.
CPC ....... *H03K 17/6872* (2013.01); *H03K 17/302* (2013.01)

(58) Field of Classification Search
CPC .... H03K 7/6872; H03K 7/6877; H03K 7/785; H03K 17/08; H03K 3/012; H03K 3/013; H03K 3/017; H03K 3/0375; H03K 3/356052; H03K 3/356086; H03K 3/356104; H03K 3/356113; H03K 3/35625; H03K 17/6872; H03K 19/018592; H03K 19/018507; H03K 17/302; H03K 19/00315; H03K 19/017545; H03K 17/6871; H03K 17/6877; H03K 17/785
See application file for complete search history.

(56) References Cited

U.S. PATENT DOCUMENTS

| | | | |
|---|---|---|---|
| 5,118,968 A | 6/1992 | Douglas et al. | |
| 5,723,990 A | 3/1998 | Roohparvar | |
| 5,745,323 A * | 4/1998 | English ............ | H03K 19/00315 361/111 |
| 5,880,617 A * | 3/1999 | Tanaka ............. | H03K 19/00315 327/333 |
| 6,946,892 B2 * | 9/2005 | Mitarashi ......... | H03K 3/356113 326/81 |
| 7,446,589 B2 * | 11/2008 | Ijitsu ........................ | G06F 1/04 327/112 |
| 2019/0007031 A1 | 1/2019 | Kwon et al. | |

* cited by examiner

*Primary Examiner* — Jung Kim
(74) *Attorney, Agent, or Firm* — Slater Matsil, LLP

(57) ABSTRACT

A device includes a first connection pin, a second connection pin, a third connection pin, and a fourth connection pin. The second connection pin is configured to be connected to a supply voltage. The fourth connection pin is configured to be coupled to a reference voltage. The device further includes a first transistor including: a first gate and a first source/drain coupled to the first connection pin; a second transistor including a second gate and a second source/drain connected to the first transistor; and a third transistor including a third gate, a third source/drain connected to the second transistor, and a fourth source/drain connected to the fourth connection pin. The third transistor is configured to be controlled by a digital signal using the third connection pin. Both the first gate and the second gate are directly connected to the second connection pin.

20 Claims, 3 Drawing Sheets

SWITCHABLE DIODE DEVICES HAVING TRANSISTORS IN SERIES

CROSS-REFERENCE TO RELATED APPLICATIONS

This application claims priority to French Patent Application No. 1904484, filed on Apr. 26, 2019, which application is hereby incorporated herein by reference.

TECHNICAL FIELD

The present disclosure relates generally to electronic devices and, more specifically, to chips integrating one or more input-output circuits comprising connection pads.

BACKGROUND

Input-output circuits, integrated in a chip, that comprise so-called "intolerant" connection pads are known. These intolerant pads typically have means of protection against possible current injections. The current injections via connection pads can, in certain cases, produce harmful effects for the chip. It is thus desirable to guard against these current injections, generally by using diodes. One of the drawbacks linked to the use of these diodes stems from the fact that this restricts a range of input voltages admissible by the circuit. This restriction sometimes turns out to be detrimental to certain applications, for which a larger range of voltages is desirable.

Input-output circuits comprising so-called "tolerant" connection pads are also known. By means of these circuits equipped with tolerant pads, it is possible, compared to circuits equipped with intolerant pads, to expand the range of admissible input voltages without risking a degradation of the chip as well as of the signal applied on the pad. It is in particular possible, for specific applications, to bring these tolerant pads to electrical potentials substantially higher than a supply potential for supplying the chip. The intolerant pads cannot, however, in certain applications, be replaced by tolerant pads.

Currently, a decision is made before the manufacture of the chip regarding which type (tolerant or intolerant pad) the pad of each input-output circuit will be. This decision is, most of the time, conditioned by the target applications. Once the chip has been manufactured, the type of pad of each input-output circuit is no longer modifiable. This thus imparts a poor flexibility to existing input-output circuits.

SUMMARY

Embodiments provide flexibility of existing input-output circuits.

One embodiment addresses all or some of the drawbacks of known input-output circuits.

One embodiment provides a device comprising, in series, a first transistor, a second transistor, connected to the first transistor and a third transistor, connected to the second transistor, said third transistor being controlled by a digital signal.

According to an embodiment, the transistors are MOS transistors.

According to an embodiment the first transistor is a P-type transistor, the second transistor is an N-type transistor and the third transistor is an N-type transistor.

According to an embodiment the drain of the second transistor is connected to the drain of the first transistor and the source of the second transistor is connected to the drain of the third transistor.

According to an embodiment, a reference potential is applied on the source of the third transistor.

According to an embodiment, a DC voltage is applied between the common gates of the first and second transistors and the source of the third transistor.

According to an embodiment, the digital signal is adapted to control, in an ON/OFF manner, the passage of a current in the association in series.

According to an embodiment, the association in series forms, as a function of the state of the digital signal controlling the third transistor, sometimes a diode and sometimes an open circuit.

One embodiment provides a device comprising exclusively three transistors as described.

One embodiment provides an electronic chip comprising at least one such device.

According to an embodiment, the source of the first transistor of said device is coupled to at least one connection pad of the chip.

According to an embodiment, a supply voltage of the chip is applied between the common gates of the first and second transistors and the source of the third transistor.

One embodiment provides a method for controlling such a device, wherein the digital control signal is placed in a first state for imparting a diode function and the digital control signal is placed in a second state for forcing an open circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

Like features have been designated by like references in the various figures. In particular, the structural and/or functional features that are common among the various embodiments may have the same references and may have identical structural, dimensional and material properties.

DETAILED DESCRIPTION OF ILLUSTRATIVE EMBODIMENTS

For the sake of clarity, only the operations and elements that are useful for an understanding of the described embodiments herein have been illustrated and described in detail. In particular, the generation of the signals to be transmitted by the input-output circuits and the processing of these signals have not been described in detail, the described embodiments being compatible with conventional applications of input-output circuits.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
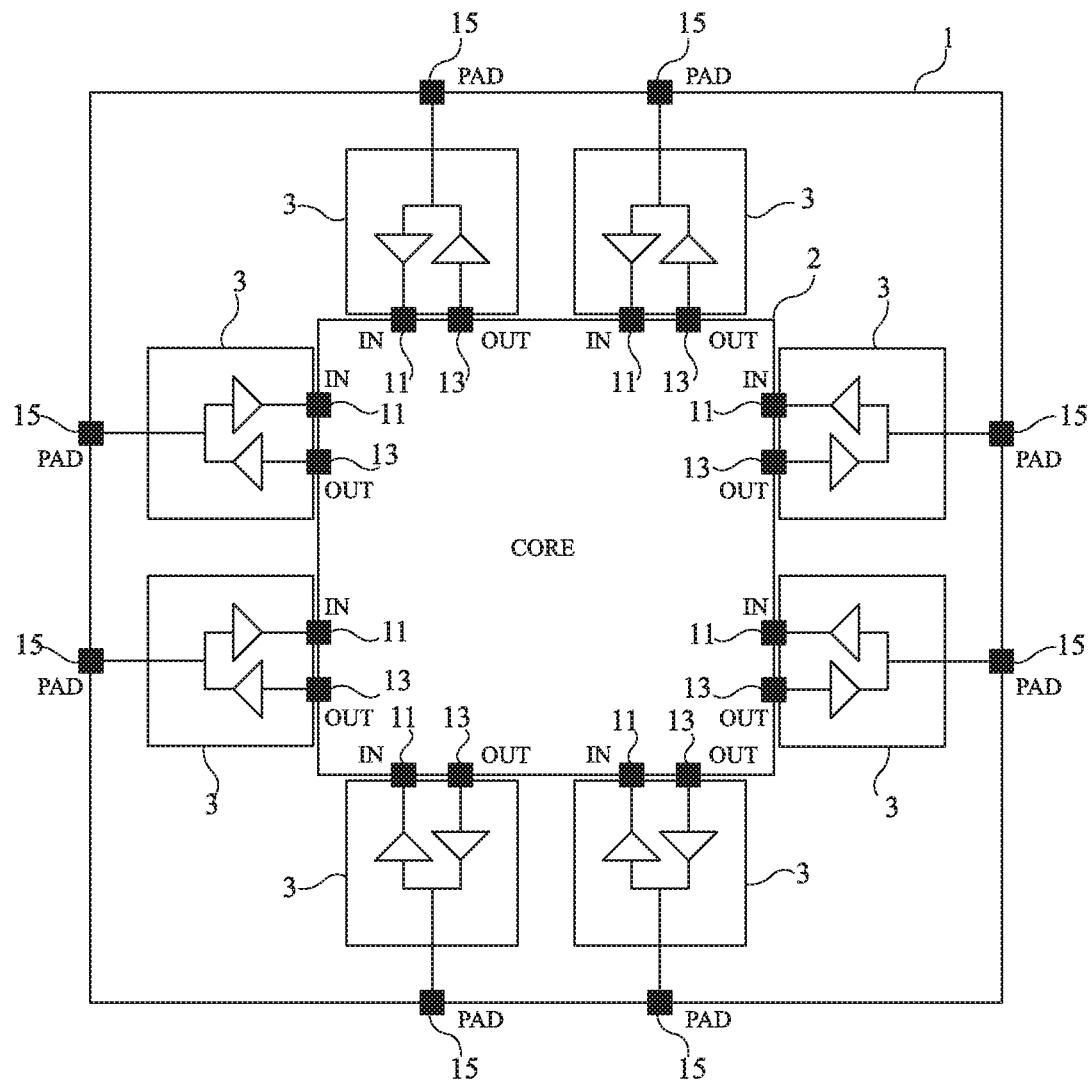
FIG. 1 illustrates, in a schematic fashion, an example electronic chip.

FIG. 1 illustrates, in a schematic fashion, an example electronic chip 1.

In the example shown in FIG. 1, the electronic chip 1 comprises circuits 3 or input-output cells. The input-output circuits 3 allow the core 2 (CORE) of the chip 1 to communicate with the outside. Each input-output circuit 3 is, still in the example shown in FIG. 1, connected to an input terminal 11 (IN) of the core 2 of the chip 1, an output terminal 13 (OUT) of the core 2 of the chip 1 and a pad 15 (PAD) allowing, for example, a connection of the chip 1 to contact elements (not illustrated) located at the surface of a circuit board (not illustrated).

The input-output circuits 3 typically form an input-output ring (I/O ring). These input-output circuits 3 allow, for example, the core 2 of the chip 1 to exchange digital signals with the outside. The input-output circuits 3 generally ensure a protective function against electrostatic discharges capable of damaging the core 2 of the chip 1.

Figure 2:
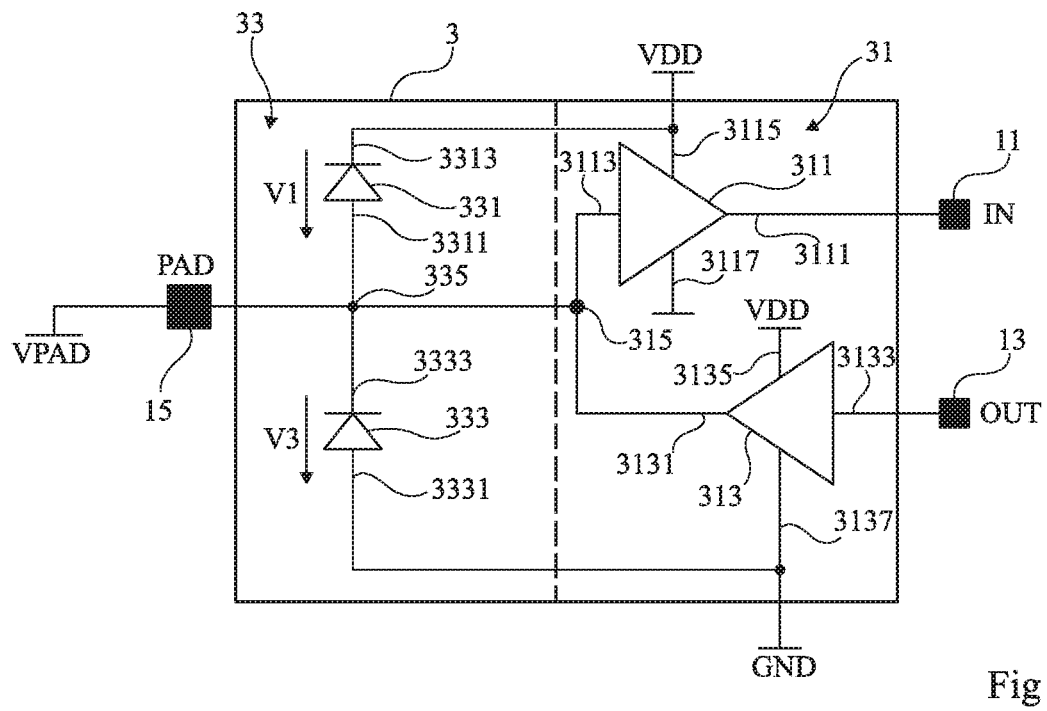
FIG. 2 illustrates, in a schematic fashion, an example input-output circuit of an electronic chip.

FIG. 2 illustrates, in a schematic fashion, an example input-output circuit 3 of an electronic chip.

In the example shown in FIG. 2, the input-output circuit 3 (for example, one of the input-output circuits 3 of the chip 1 as shown in FIG. 1) is composed of a levelling circuit 31, comprising in particular two amplifiers or buffer circuits (buffers) 311 and 313 and of a protective circuit 33, comprising in particular two diodes 331 and 333.

In the following, the buffer circuits 311 and 313 will be designated as amplifiers, although it is clear that they do not necessarily amplify the digital signal applied on their input. Their first function is to bring the high and low input levels to the respective supply potentials of the circuit 311, 313 in question (in the example, the potential VDD and ground GND), with the exception of the drops in voltage in the one or more transistors constituting the circuit 311, 313 in the on state.

An output 3111 of the amplifier 311 of the levelling circuit 31 is, in FIG. 2, connected to the input terminal 11 (IN) of the core 2 (FIG. 1) of the chip 1. An input 3133 of the amplifier 313 is connected to the output terminal 13 (OUT) of the core 2 (FIG. 1) of the chip 1. An output 3131 of the amplifier 313 and an input 3113 of the amplifier 311 are connected to each other, in this example by way of a common connection node 315. This connection node 315 is connected to the connection pad 15 (PAD) of the chip 1.

A positive supply pin 3115 of the amplifier 311 and a positive supply pin 3135 of the amplifier 313 are, in FIG. 2, both brought to a same electrical potential VDD. This potential VDD generally corresponds to a supply voltage of the chip 1 from a supply source (not illustrated). The voltage VDD is typically comprised between 1.8 V and 3.6 V. A negative supply pin 3117 of the amplifier 311 is brought to any electrical potential (not illustrated). A negative supply pin 3137 of the amplifier 313 is brought to a reference potential (typically ground, GND).

In the example shown in FIG. 2, an anode 3311 of the diode 331 of the protective circuit 33 is connected to the connection pad 15 of the chip 1. A cathode 3313 of the diode 331 is connected to the positive supply pin 3115 of the amplifier 311 of the levelling circuit 31. An anode 3331 of the diode 333 is connected to the negative supply pin 3137 of the amplifier 313 of the levelling circuit 31. A cathode 3333 of the diode 333 is connected to the connection pad 15 of the chip 1. The cathode 3313 of the diode 331 is thus brought to the potential VDD while the anode 3331 of the diode 333 is grounded GND. It is assumed in the following, for the purposes of simplification, that the ground potential GND is zero (GND=0 V). The potential GND thus constitutes a reference potential for the circuit 1.

The anode 3311 of the diode 331 and the cathode 3333 of the diode 333 of the protective circuit 33 of the chip 1 are, in FIG. 2, both connected in a further connection node 335. The pad 15, the connection nodes 315 and 335, the anode 3311 of the diode 331, the cathode 3333 of the diode 333, the input 3113 of the amplifier 311 and the output 3131 of the amplifier 313 are thus (with the exception of the drops in parasitic voltages in the conductors) at the potential of the pad PAD, designated as VPAD.

The diodes 331 and 333 of the protective circuit 33 are on, i.e. they let through an electrical current, when they are biased by a voltage greater than a threshold voltage, designated as VSEUIL. It is assumed in the following, for the purposes of simplification, that the diodes 331 and 333 are both characterized by an identical threshold voltage VSEUIL. This threshold voltage VSEUIL is typically in the order of 0.7 V for a silicon diode (PN junction).

For the purposes of simplification, avalanche phenomena potentially occurring in the diodes 331 and 333 in the case of an application of a strong inverse voltage are disregarded. The diode 331 is thus only considered on if a voltage V1 at least equal to the voltage VSEUIL is applied between its anode 3311 and its cathode 3313. Otherwise (if the voltage V1 is strictly lower than the voltage VSEUIL), the diode 331 is considered off, i.e. it does not let any current through. In the example shown in FIG. 2, the voltage V1 is equal to VPAD-VDD.

Similarly, the diode 333 is only considered on if a voltage V3, at least equal to the voltage VSEUIL, is applied between its anode 3331 and its cathode 3333. Otherwise (if the voltage V3 is strictly lower than the voltage VSEUIL), the diode 333 is considered off, i.e. it does not let any current through. In the example shown in FIG. 2, the voltage V3 is equal to -VPAD.

Three cases of operation are thus theoretically possible, as a function of the value of the voltage VPAD, for the input-output circuit 3 in a first case, if the voltage VPAD is strictly comprised between -VSEUIL and VDD+VSEUIL, the diodes 331 and 333 are off (as the voltages V1 and V3 are thus both strictly lower than the voltage VSEUIL), in a second case, if the voltage VPAD is lower than or equal to -VSEUIL, the diode 333 is on (as the voltage V3 is thus greater than or equal to the voltage VSEUIL) while the diode 331 is off (as the voltage V1 is thus strictly lower than the voltage VSEUIL) and in a third case, if the voltage VPAD is greater than or equal to VDD+VSEUIL, the diode 331 is on (as the voltage V1 is thus greater than or equal to the voltage VSEUIL) while the diode 333 is off (as the voltage V3 is thus strictly lower than the voltage VSEUIL).

The first case of operation corresponds to a normal situation. In this situation, the input-output circuit 3 of the chip 1 accommodates, on its pad 15, a range of voltages VPAD comprised between −VSEUIL and VDD+VSEUIL. The pad 15 of the circuit 3 is thus considered an "intolerant pad".

The second case typically corresponds to an abnormal situation due to a negative injection, or negative overvoltage, on the pad 15. The diode 333 being on in this case, a current can thus flow from the ground GND toward the pad 15, which makes it possible to protect the levelling circuit 31 against the negative overvoltage.

The third case typically corresponds to a further abnormal situation due to a positive injection, or positive overvoltage, on the pad 15. The diode 331 being on in this case, a current can thus flow from the pad 15 toward a supply source of the chip 1, which makes it possible to protect the levelling circuit 31 against the positive overvoltage.

The diodes 331 and 333 of the protective circuit 33 thus make it possible to protect the levelling circuit 31 of the input-output circuit 3 against possible overvoltages, positive or negative. The diode 331 constitutes an injection path towards the supply VDD. The diode 333 constitutes an extraction path from the ground GND.

A drawback linked to the implementation of the diodes 331 and 333 resides in the fact that one is forced, during normal operation, to avoid exceeding, on the pad 15 of the chip 1, a voltage VPAD approximately equal to VDD+VSEUIL. This constraint can prevent the chip 1 from being used for applications where there is a need to apply a voltage VPAD substantially greater than VDD+VSEUIL.

Figure 3:
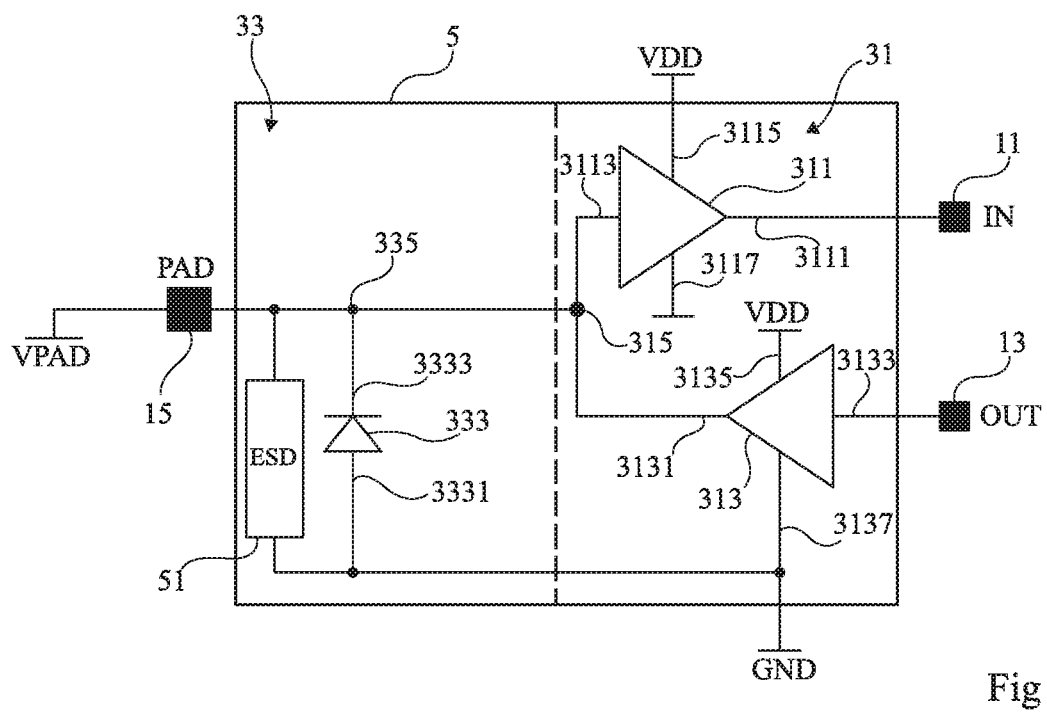
FIG. 3 illustrates, in a schematic fashion, a further example input-output circuit of an electronic chip.

FIG. 3 illustrates, in a schematic fashion, a further example input-output circuit 5 of an electronic chip.

The input-output circuit 5 shown in FIG. 3 is, for example, a further input-output circuit of the chip 1. This input-output circuit 5 comprises elements in common with the input-output circuit 3 shown in FIG. 2. These common elements will not be described again in detail in the following.

The input-output circuit 5 of FIG. 3 differs from the input-output circuit 3 of FIG. 2 mainly in that the circuit 5 does not comprise a diode 331. There is thus, in the input-output circuit 5, no possible path of injection toward the supply VDD.

The absence of the diode 331 (FIG. 2) allows the input-output circuit 5 shown in FIG. 3 to accept, on its pad 15, an expanded range of voltages compared to the range of admissible voltages of the circuit 3. This allows, for example, a chip 1 to use a same pad 15 to convey various types of signals as a function of one or more applications. It is thus in particular possible to apply, on the pad 15 of the circuit 5, a voltage VPAD substantially greater than VDD. This operation is also possible as it is possible by means of the design of the amplifiers 331 and 333 to support voltages greater than the voltage VDD on the pad 15 without risking a degradation of the components and without triggering an excessive leakage current that could alter the integrity of the signal applied on the pad 15. For a supply voltage VDD in the order of 3 V, a voltage VPAD in the order of 5 V can thus typically be imposed on the pad 15. The pad 15 of the circuit 5 is considered a "tolerant pad".

The protective circuit 33 comprises, in FIG. 3, an additional component 51 (ESD) by means of which it is possible to protect the levelling circuit 31 against possible electrostatic discharges. This component 51 is, in this example, connected in parallel to the diode 333.

However, the chip 1 is thus not protected against sustained positive voltages and it must be ensured that the application (connected to the pad 15) does not impose a positive voltage greater than what the components of the chip 1 can support. The protection ESD of the component 51, indeed, only protects against temporary overvoltages.

It is not possible with the input-output circuit 5 of the chip 1, however, to satisfy applications for which the diode 331 (FIG. 2) is needed. In other words, the circuits 3 (FIG. 2) and 5 each have different advantages, inherent in the presence or absence of the diode 331 (FIG. 2).

Figure 4:
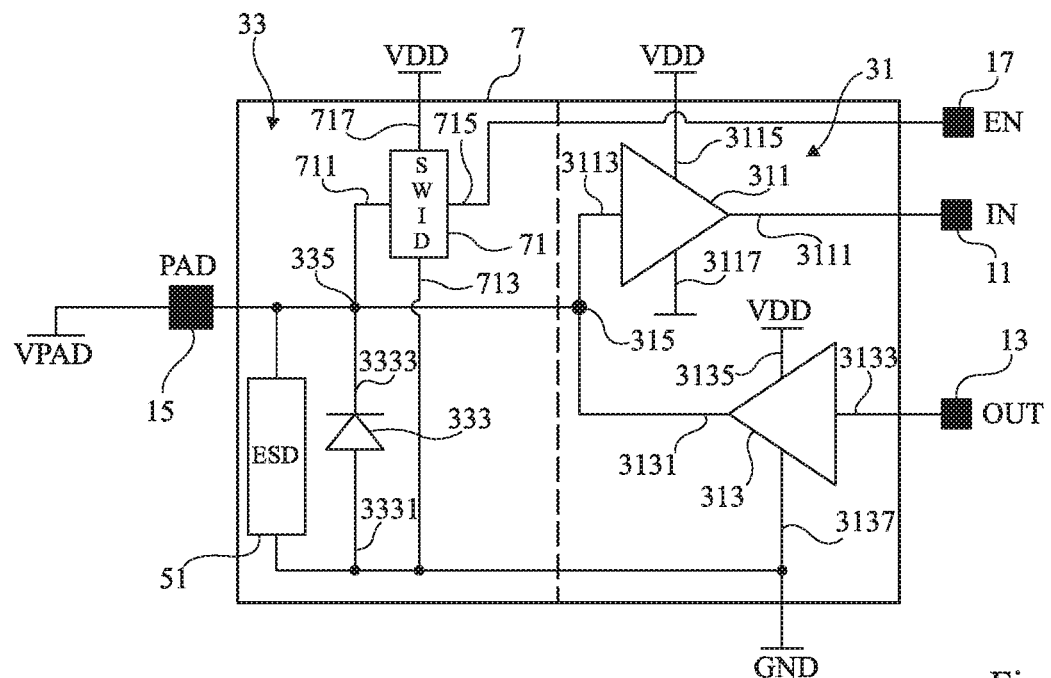
FIG. 4 illustrates, in a schematic fashion, an embodiment of an input-output circuit of an electronic chip.

FIG. 4 illustrates, in a schematic fashion, an embodiment of an input-output circuit 7 of an electronic chip.

According to this embodiment, the input-output circuit 7 shown in FIG. 4 is, for example, yet a further input-output circuit of the chip 1. This input-output circuit 7 comprises elements in common with the input-output circuit 5 shown in FIG. 3. These common elements will not be described again in detail in the following.

The input-output circuit 7 shown in FIG. 4 differs from the input-output circuit 5 shown in FIG. 3 mainly in that the circuit 7 comprises an additional component 71 (SWID), or switchable diode, and an additional terminal 17 (EN). The switchable diode 71 is, in FIG. 4, connected by a first connection pin 711, to the connection node 335, by a second connection pin 713, to ground GND, by a third connection pin 715, to the terminal 17 of the chip 1 and by a fourth connection pin 717, to a supply source (not illustrated) applying the potential VDD.

The terminal 17 is, preferably, on the side of the chip core (not illustrated in FIG. 4), which makes it possible to avoid modifying the number of pads external to the chip 1.

A digital signal (or ON/OFF signal), designated as CMD, is applied on the terminal 17 of the chip 1. The digital signal CMD thus reaches the switchable diode 71 by way of its third pin 715. This digital signal CMD is adapted to control the switchable diode 71.

According to a preferred embodiment, a first state, preferably a high state, of the control signal CMD allows the switchable diode 71 to behave like a diode in which an anode, corresponding to the first pin 711 of the switchable diode 71, is brought to the potential VPAD and a cathode, corresponding to the third pin 715 of the switchable diode 71, is brought to the potential VDD.

When the signal CMD is in the high state, everything works as if the input-output circuit 7 shown in FIG. 4 comprised a diode between the terminal 15 of the chip 1 and the supply VDD. In other words, the circuit 7 is thus comparable to the circuit 3 (FIG. 2), with the exception that the switchable diode 71 of the circuit 7 provides an injection path towards the ground GND while the diode 331 of the circuit 3 provides an injection path towards the supply VDD. When the signal CMD is in the high state, one thus reverts to an operation of the circuit 7 equivalent to that of the circuit 3 (FIG. 2), with the difference that a positive overvoltage (VPAD≥VDD+VSEUIL) is no longer evacuated toward the supply VDD, but toward the ground GND.

According to this embodiment, a second state, preferably a low state, of the control signal CMD makes it possible to form, between the first pin 711 and the second pin 713 of the switchable diode 71, an open circuit.

When the signal CMD is in the low state, the circuit 7 is thus comparable to the circuit 5 shown in relation to FIG. 3. When the signal CMD is in the low state, one thus reverts to an operation of the circuit 7 similar to that of the circuit 5 (FIG. 3).

Depending on the state of the signal CMD applied on the terminal 17 of the chip 1, it is thus possible to obtain, still in accordance with a preferred embodiment sometimes an intolerant pad 15, i.e. a component 71 behaving like a diode, when the signal CMD is in the high state and sometimes a tolerant pad 15, i.e. a component 71 behaving like an open circuit, when the signal CMD is in the low state.

Compared to the circuit 3 (FIG. 2) and the circuit 5 (FIG. 3), the circuit 7 of the chip 1 has the advantage that it possesses a configurable pad 15, as a tolerant pad or as an intolerant pad, as a function of the state of the digital signal CMD applied on the terminal 17 of the chip 1. This thus imparts a greater flexibility to the circuit 7 and, more specifically, to the chip 1.

Figure 5:
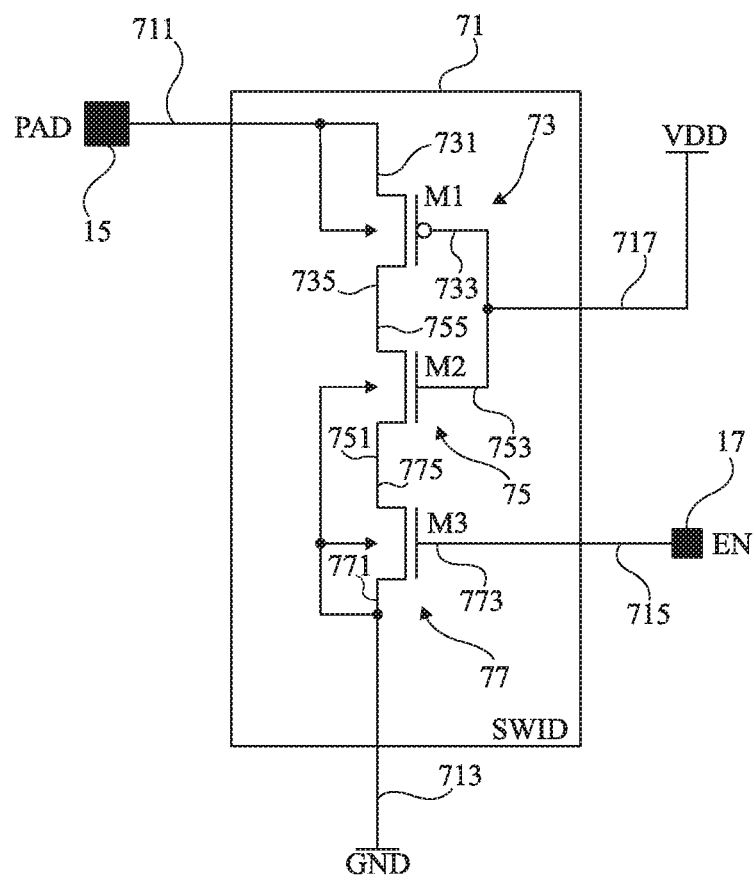
FIG. 5 illustrates, in a schematic fashion, an embodiment of a diode that is switchable by a digital signal.

FIG. 5 illustrates, in a schematic fashion, an embodiment of a diode that is switchable by a digital signal.

According to this embodiment, a switchable diode, for example the switchable diode 71 (SWID) of the circuit 7 (FIG. 4), is composed, preferably, of an assembly in series of a first transistor 73 (M1), of a second transistor 75 (M2) and of a third transistor 77 (M3).

The transistors 73, 75 and 77 of the switchable diode 71 are, preferably, field-effect transistors of the MOS type. In the example shown in FIG. 5, the transistors 75 and 77 of the switchable diode 71 have, compared to the transistor 73, a different type of conductivity. The transistor 71 is, preferably, a P-type or P-channel MOS transistor (or P-channel MOSFET, PFET, PMOS, etc.) while the transistors 75 and 77 are both N-type or N-channel MOS transistors (or N-channel MOSFET, NFET, NMOS, etc.).

According to a preferred embodiment, the first transistor 73 is such that a source 731 of the first transistor 73 is connected to the terminal 15 of the chip 1, a gate 733 of the first transistor 73 is brought to the supply potential VDD of the chip 1 and a drain 735 of the first transistor 73 is connected to a drain 755 of the second transistor 75.

The second transistor 75 is, still in accordance with this preferred embodiment, such that a source 751 of the second transistor 75 is connected to a drain 775 of the third transistor 77, a gate 753 of the second transistor 75 is brought to the supply potential VDD of the chip 1 and a drain 755 of the second transistor 75 is connected to the drain 735 of the first transistor 73.

The third transistor 77 is, still in accordance with this preferred embodiment, such that a source 771 of the third transistor 77 is grounded GND, a gate 773 of the third transistor 77 is connected to the terminal 17 of the chip 1 and the drain 775 of the third transistor 77 is connected to the source 751 of the second transistor 75.

Referring to the designations of FIG. 4: the source 731 of the first transistor 73 is connected to the first pin 711 of the switchable diode 71, the gate 733 of the first transistor 73 and the gate 753 of the second transistor 75 are interconnected to form the fourth pin 717 of the switchable diode 71, the gate 773 of the third transistor 77 is connected to the third pin 715 of the switchable diode 75 and the source 771 of the third transistor 77 is connected to the second pin 713 of the switchable diode 71.

The bulks of the transistors M2 and M3 are interconnected to the source 771 of the transistor M3 (ground GND).

The bulk of the transistor M1 is connected to the source 731 of the transistor M1 (pad 15).

A DC voltage (VDD), preferably the supply voltage of the chip 1, is thus applied between: the common gates 733 and 753 of the first and second transistors 73 and 75 and the source 771 of the third transistor 77.

For the purposes of simplification, all the transistors 73, 75 and 77 are considered as having a same threshold voltage value, designated as VTH.

The first transistor 73 is theoretically on if a voltage higher than or equal to the voltage VTH is applied between its source 731 and its gate 733. The first transistor 73 is theoretically off if a voltage strictly lower than the voltage VTH is applied between its source 731 and its gate 733.

The second transistor 75 is theoretically on if a voltage greater than or equal to the voltage VTH is applied between its gate 753 and its source 751. The second transistor 75 is theoretically off if a voltage strictly lower than the threshold voltage VTH is applied between its gate 753 and its source 751.

The third transistor 77 is theoretically on if a voltage greater than or equal to the voltage VTH is applied between its gate 773 and its source 771. The second transistor 77 is theoretically off if a voltage strictly lower than the threshold voltage VTH is applied between its gate 773 and its source 771.

It has been observed in the foregoing that the source 731 of the first transistor 73 is connected to the pad 15 of the chip 1. The source 731 of the first transistor 73 is thus placed at the potential VPAD. The gate 773 of the third transistor 77 is connected to the terminal 17 of the chip 1. The gate 773 of the third transistor 77 is thus controlled by the digital signal CMD.

It is assumed that a high state (CMD=1) of the signal CMD is encoded by the application, on the terminal 17, of a voltage greater than or equal to VTH. The third transistor 77 is thus on when the signal CMD is in the high state.

It is assumed that a low state (CMD=0) of the signal CMD is encoded by the application, on the terminal 17, of a voltage strictly lower than VTH. The third transistor 77 is thus off when the signal CMD is in the low state.

A plurality of cases of operation of the switchable diode 71 can thus occur, as a function of the respective values of the potentials VDD and VPAD as well as of the digital signal CMD. These different cases of operation are listed in the table below.

TABLE 1

| Case | VDD | VPAD | CMD | Transistor 73 | Transistor 75 | Transistor 77 |
|------|------|-------------|-----|---------------|---------------|---------------|
| 1 | ≤VTH | <VDD + VTH | 0 | off | off | off |
| 2 | ≤VTH | ≥VDD + VTH | 0 | on | off | off |
| 3 | >VTH | <VDD + VTH | 0 | off | on | off |
| 4 | >VTH | ≥VDD + VTH | 0 | on | on | off |
| 5 | >VTH | <VDD + VTH | 1 | off | on | on |
| 6 | >VTH | ≥VDD + VTH | 1 | on | on | on |

A current can thus theoretically only flow, between the terminal 15 and the ground GND of the chip 1, if all transistors 73, 75 and 77 of the switchable diode 71 are on. Based on the table above, it is evident that the switchable diode 71 is only on in case 6. The switchable diode 71 is thus on if the voltage VPAD is greater than or equal to VDD+VTH, if the signal CMD is in the high state and if the voltage VDD is greater than the threshold voltage VTH.

When the signal CMD is in the high state (case 5 and case 6), the switchable diode 71 thus behaves like a diode characterized by a threshold voltage equal to VTH. When the signal CMD is in the low state (cases 1 to 4), the switchable diode 71 behaves, on the other hand, like an open circuit.

The switchable diode 71 distinguishes itself from the diode 331 (FIG. 2) in that it prohibits any injection of current toward the supply VDD when the chip 1 is disconnected from a voltage supply (i.e. when the supply of the chip 1 is turned off, VDD=0).

Assuming that the voltage VDD is zero, i.e. that it is desired to keep the chip 1 switched off or disconnected from a voltage supply, the application of a voltage to a pad 15 associated with a diode 331 (as shown in relation to FIG. 2) can cause an injection of current toward the supply VDD. There is thus a risk of preventing the disconnection or switching off of the chip 1. On the other hand, the application of a voltage to a pad 15 associated with a switchable diode 71 cannot cause an injection of current toward the supply VDD. The chip 1 is thus kept disconnected or switched off.

The switchable diode 71 has, as a consequence, the advantage of preventing the chip 1 that it is desired to keep disconnected from being involuntarily resupplied by the application of a voltage on the pad 15.

Various embodiments and variants have been described. Those skilled in the art will understand that certain features of these embodiments can be combined and other variants will readily occur to those skilled in the art. In particular, what has been shown more specifically in relation to an example application to an input-output circuit applies more generally to any electronic circuit in which it is desired to realize a switchable diode 71.

Finally, the practical implementation of the embodiments and variants described herein is within the capabilities of those skilled in the art based on the functional description provided hereinabove.

What is claimed is:

1. A switchable diode device comprising:
    a first external signal connection pin;
    a first transistor comprising a first gate connection node and a first source/drain connection node directly connected to the first external signal connection pin;
    a second connection pin configured to be directly connected to a supply voltage;
    a second transistor comprising a second gate connection node and a second source/drain connection node directly connected to the first transistor, wherein both the first gate connection node and the second gate connection node are directly connected to the second connection pin;
    a third connection pin;
    a fourth connection pin configured to be coupled to a reference voltage; and
    a third transistor comprising a third gate connection node, a third source/drain connection node connected to the second transistor, and a fourth source/drain connection node connected to the fourth connection pin, wherein the third transistor is configured to be controlled by a digital signal using the third connection pin.

2. The device according to claim 1, wherein the transistors are MOS transistors.

3. The device according to claim 2,
    wherein the first transistor is a P-type transistor,
    wherein the second transistor is an N-type transistor, and
    wherein the third transistor is an N-type transistor.

4. The device according to claim 1,
    wherein the second source/drain connection node is a drain of the second transistor connected to a drain of the first transistor, and
    wherein the third source/drain connection node is a drain of the third transistor connected to a source of the second transistor.

5. The device according to claim 1, wherein a current in a series connection of the transistors is controlled by the digital signal in an ON/OFF manner.

6. The device according to claim 1, wherein the device is configured to function as a diode or as an open circuit based on a state of the digital signal controlling the third transistor.

7. The device according to claim 1, wherein the device consists of three transistors.

8. An electronic chip comprising:
    at least one device according to claim 1.

9. The chip according to claim 8,
    wherein the first source/drain connection node of the first transistor is coupled to at least one connection pad of the chip.

10. The chip according to claim 8, wherein a voltage differential equal to the supply voltage of the chip is configured to be applied between the second connection pin and the fourth source/drain connection node that is a source of the third transistor.

11. A method for-controlling a device to dynamically select between intolerant pad behavior and tolerant pad behavior of an external pad of an electronic chip, wherein the device comprises a first P-type transistor directly connected to both the external pad and a common connection node of a levelling circuit connected to a core of the electronic chip, the first P-type transistor, a second N-type transistor and a third N-type transistor being arranged in a series connection, the method comprising:
    providing a substantially time invariant supply voltage to a common gate connection node of the first P-type transistor and the second N-type transistor;
    selecting intolerant pad behavior for the external pad by providing a digital control signal in a first state to the third N-type transistor so that the device provides a diode function; and
    selecting tolerant pad behavior for the external pad by providing the digital control signal in a second state to the third N-type transistor so that the device provides an open circuit.

12. A switchable diode device comprising:
    a first external signal connection pin;
    a first transistor being a P-type transistor and comprising a first gate and a source directly connected to the first external signal connection pin;
    a second connection pin configured to be directly connected to a supply voltage;
    a second transistor being an N-type transistor and comprising a second gate;
    a third connection pin;
    a fourth connection pin configured to be coupled to a reference voltage; and
    a third transistor being an N-type transistor and comprising a third gate,
        wherein a drain of the second transistor is directly connected to a drain of the first transistor,
        wherein both the first gate and the second gate are directly connected to the second connection pin,
        wherein a source of the second transistor is connected to a drain of the third transistor, wherein a source of the third transistor is connected to the fourth connection pin, wherein the device is configured to operate as a diode in response to a control signal in a first state applied to the third transistor using the third connection pin, and wherein the device is configured to operate as an open circuit in response to the control signal in a second state.

13. The device according to claim 12, wherein a current in a series connection of the transistors is controlled by the control signal in an ON/OFF manner.

14. The device according to claim 12, wherein the device consists of three transistors.

15. The device of claim 1, wherein:

a first bulk connection node of the first transistor is connected to the first external signal connection pin; and both a second bulk connection node of the second transistor and a third bulk connection node of the third transistor are connected to the fourth connection pin.

16. The device of claim 1, wherein:

the first transistor comprises a fifth source/drain connection node;

the fifth source/drain connection node of the second transistor is connected to the first transistor using the fourth source/drain connection node; and the device comprises no additional connection nodes between the second source/drain connection node and the fifth source/drain connection node.

17. The device of claim 9, wherein:

the at least one connection pad is configured to operate as a tolerant pad in response to the digital signal in a first state applied to the third transistor; and the at least one connection pad is configured to operate as an intolerant pad in response to the digital signal in a second state applied to the third transistor.

18. The device of claim 12, wherein:

a first bulk connection of the first transistor is connected to the first external signal connection pin; and both a second bulk connection of the second transistor and a third bulk connection of the third transistor are connected to the fourth connection pin.

19. The device of claim 12, wherein the device comprises no additional connection nodes between the drain of the first transistor and the drain of the second transistor.

20. The device of claim 12, wherein:

the first external signal connection pin is coupled to at least one connection pad of a chip;

the at least one connection pad is configured to operate as an intolerant pad in response to the control signal being in the first state; and the at least one connection pad is configured to operate as a tolerant pad in to the control signal being in the second state.

* * * * *